United States Patent [19]

Gwilliam et al.

[11] Patent Number: 5,431,021

[45] Date of Patent: Jul. 11, 1995

[54] THERMOELECTRIC DEVICE WITH A PLURALITY OF MODULES INDIVIDUALLY CONTROLLED

[76] Inventors: Scott B. Gwilliam, 5958 S. Jordan Canal Rd., Salt Lake City, Utah 84118; Richard A. Pell, 5188 S. Iroquois Way, Ogden, Utah 84403; Aaron V. Farr, 820 E. 1850 North, North Ogden, Utah 84414

[21] Appl. No.: 186,972

[22] Filed: Jan. 26, 1994

Related U.S. Application Data

[63] Continuation of Ser. No. 982,351, Nov. 27, 1992, abandoned.

[51] Int. Cl.6 .............................................. F25B 21/02
[52] U.S. Cl. .......................................... 62/3.7; 62/3.2
[58] Field of Search ..................... 62/3.2, 3.3, 3.4, 3.6, 62/3.7

[56] References Cited

U.S. PATENT DOCUMENTS

| | | |
|---|---|---|
| 2,494,785 | 1/1950 | Tramontini et al. . |
| 2,495,625 | 1/1950 | Bodinus . |
| 2,585,570 | 2/1952 | Messinger et al. . |
| 2,586,002 | 2/1952 | Carson, Jr. et al. . |
| 2,694,537 | 11/1954 | Reichert . |
| 2,718,766 | 9/1955 | Imperatore et al. . |
| 2,979,916 | 4/1962 | Mason . |
| 3,119,239 | 1/1964 | Sylvan . |
| 3,137,142 | 6/1964 | Venema . |
| 3,218,819 | 11/1965 | Crotser . |
| 3,303,726 | 2/1967 | Beck .................................. 62/3.7 |
| 3,399,545 | 9/1968 | Anderson et al. . |
| 3,415,313 | 12/1968 | Olstad . |
| 3,464,226 | 9/1969 | Kramer . |
| 3,521,460 | 7/1970 | Knowles . |
| 3,587,243 | 6/1971 | Keller et al. . |
| 3,613,392 | 12/1969 | Di Tucci . |
| 3,626,704 | 12/1972 | Coe, Jr. . |
| 3,726,100 | 4/1973 | Widakowich . |
| 3,777,506 | 12/1973 | Hergatt et al. . |
| 4,038,831 | 8/1977 | Gaudel et al. . |
| 4,051,691 | 10/1977 | Dawkins . |
| 4,251,994 | 2/1981 | Reinhorn . |
| 4,272,967 | 6/1981 | White et al. . |
| 4,297,849 | 11/1981 | Buffet . |

(List continued on next page.)

FOREIGN PATENT DOCUMENTS

| | | |
|---|---|---|
| 261037 | 8/1949 | France . |
| 1026985 | 5/1953 | France . |
| 1042686 | 11/1953 | France . |

(List continued on next page.)

OTHER PUBLICATIONS

Air-A-Plane Corp., Air Conditioner, Heater Brochure, Undated, 186-194.

Lear Siegler, Inc., Leading the Industry in Ground Support Air Conditioning Systems, Undated, pp. 182-188.

(List continued on next page.)

Primary Examiner—John M. Sollecito

[57] ABSTRACT

A heating and cooling apparatus having a first gas conduit, a second gas conduit and at least one thermoelectric module. In a first embodiment, structure is provided to introduce moisture into the second gas conduit, upstream of that conduit's association with the thermoelectric module. The introduction of the moisture into the gas within the second gas conduit functions to decrease the temperature between the temperature of the gas in the first conduit and the temperature of the gas in the second conduit, thereby optimizing the operation of the thermoelectric module. In a second embodiment a plurality of thermoelectric modules are arranged in an array and positioned between the gas conduits and associated therewith. The power supplied to each of the thermoelectric modules is adjusted to correspond to an optimum power input calculated for each thermoelectric module respectively. This calculation utilizes a temperature differential between the temperature of the thermoelectric material at the junction of the thermoelectric module with the first gas conduit and the temperature of the thermoelectric material at the junction of the thermoelectric module with the second gas conduit.

12 Claims, 10 Drawing Sheets

U.S. PATENT DOCUMENTS

| | | |
|---|---|---|
| 4,334,411 | 6/1982 | Payne . |
| 4,352,273 | 10/1982 | Kinsell et al. . |
| 4,357,860 | 11/1982 | Krzak . |
| 4,499,329 | 2/1985 | Benicourt et al. . |
| 4,620,339 | 11/1986 | Shepheard . |
| 4,632,019 | 12/1986 | Whiteman . |
| 4,745,770 | 5/1988 | Mintz . |
| 4,835,977 | 6/1989 | Haglund et al. . |
| 5,349,821 | 9/1994 | Schrage ................................. 62/3.7 |

FOREIGN PATENT DOCUMENTS

| | | |
|---|---|---|
| 901252 | 8/1962 | United Kingdom . |
| 1385881 | 3/1975 | United Kingdom . |
| 2015723 | 9/1979 | United Kingdom . |
| 2026152 | 1/1980 | United Kingdom . |

OTHER PUBLICATIONS

David F. Rider Amraes, Janes Airport Equipemnt, 1983–84, pp. 179–181.

Melcor Catalog, Frigichip Miniature Ceramic Modules Series FC, Jun. 1, 1987, 48 pages.

TNEE air industrie thermoelectrics, Thermoelectric Air Cooling Equipments with heat rejection to air, Undated, 1 page.

John and Daniel Stockholm Thermoelectric Modeling of a Cooling Module with Heat Exchangers, Oct. 7, 1992, pp. 140–146.

Gwilliam et al., Thermoelectric Air Conditioning Using Evaporative Cooling of Waste Heat Air for Parked Aircraft, Oct. 7, 1992, pp. 164–174.

Heenan and Mathiprakasam, Development of Two–Man Thermoelectric Microclimate Conditioner for Use in Army Ground Vehicles, Oct. 7, 1992, pp. 181–184.

David Jones, Development of a 1000–W Thermoelectric Air Conditioner, Jul. 10, 1989, pp. 232–246.

Stockholm et al., Thermoelectric Cooling for Naval Applications, Mar. 16, 1988, pp. 79–84.

Stockholm et al., Industrial Thermoelectric Cooling in the Kilowatt Range, Mar. 12, 1986, pp. 83–89.

Stockholm, Prototype Thermoelectric Air Conditioning of a Passenger Railway Coach, Mar. 12, 1984, pp. 136–141.

Stockholm, Large Gas to Gas Thermoelectric Heat Pumps, Mar. 12, 1980, pp. 120–125.

Stockholm, Large Scale Thermoelectric Cooling, Mar. 22, 1978, pp. 54–59.

Stockholm et al., Naval Thermoelectrics, Jul. 10, 1989, pp. 235–246.

% OF I (MAXIMUM)

THERMOELECTRIC DEVICE WITH A PLURALITY OF MODULES INDIVIDUALLY CONTROLLED

RELATED APPLICATIONS

This application is a continuation of U.S. patent application Ser. No. 07/982,351 filed Nov. 27, 1992 now abandoned.

BACKGROUND OF THE INVENTION

1. Field of the Invention

The invention is in the field of thermoelectric devices. The invention has special application to thermoelectric devices for heating and cooling air for human use which utilize thermoelectric modules associated with a heat exchanger.

2. State of the Art

Thermoelectric devices for heating and cooling based upon the peltier effect are well known in the prior art. Typically, a thermoelectric module is constructed of N-type and P-type semiconductor material, such as bismuth telluride. The N-type and P-type semiconductor material are electrically connected in series. When an electric current is passed through the circuit, heat is absorbed at the cold junction of the circuit and is transferred to the hot junction of the circuit. By associating the hot and cold junctions with a heat exchanger, heat can be transferred from one flow stream to another. Typically, the heat exchanger is filled with either gas or liquid media, thereby resulting in the heating of one media and the cooling of the other media.

Historically, practical applications of thermoelectric cooling and heating using thermoelectric modules have been primarily limited to small scale specialized uses because of high cost and energy inefficiencies. In the last 15 to 20 years, applications of thermoelectric modules have been developed to utilize them in large scale cooling of submarines and passenger trains. Utilization of thermoelectric modules in large scale applications has required development of various types of thermoelectric devices, which utilize thermoelectric modules associated with heat exchangers, which are designed for assembly with each other to provide the cooling and heating capacity required for large scale applications. One such prior art design for a thermoelectric device includes a parallel flow heat exchanger in association with thermoelectric modules. Another prior art design for a thermoelectric device is the "air to air cross-flow" design in which the conduits of the exchanger, which sandwich thermoelectric modules, are positioned relative to each other to allow for perpendicular flow of hot and cold air through the thermoelectric device. Typical of these thermoelectric devices are U.S. Pat. No. 3,626,704 issued to Coe on 9 Jan. 1970 and U.S. Pat. No. DE 1,801,768 issued to Newton in 1967.

The primary disadvantages of these prior art devices are lack of reliability and difficulty of service. In some prior art devices the electric current to the thermoelectric modules flows through the heat exchanger itself. To establish the electric circuit, the thermoelectric modules are electrically connected in series through the heat exchanger. In some prior art configurations, the electric connection is established by attaching a heat exchanger to the hot and cold junctions of the thermoelectric modules by soldering, thereby creating rigid physical connections between adjacent thermoelectric modules and between the heat exchanger. Since the heat exchanger conduit attached to the hot side of the thermoelectric modules and the heat exchanger conduit attached to the cold side of the thermoelectric modules are subject to different temperatures, they are expanding and contracting at different rates. This expansion and contraction differential creates a shear force across the thermoelectric modules, which may result in their breakage.

In an attempt to overcome these problems, a design, such as that typified by U.S. Pat. No. 3,726,100 issued to Widakowich on 10 Apr. 1973 was developed. In this design, the heat exchanger conduits are not soldered to the thermoelectric module, but the thermoelectric modules are sandwiched between the hot and cold heat exchanger conduits, with the hot and cold heat exchanger conduits compressed against adjacent thermoelectric modules by bolts such that the heat exchanger conduits are in electric and thermal contact with the thermoelectric modules to create an electric circuit through the heat exchanger conduits and semiconductor material such that they are connected in series. Since adjacent thermoelectric modules are still rigidly connected to each other, the shearing forces still exist to some extent.

BRIEF SUMMARY OF THE INVENTION

A heating and cooling apparatus adapted for treating a fluid, such as a gas is disclosed. The apparatus is specifically adapted for use in heating or cooling air for human use, e.g. for breathing. The apparatus includes a first fluid conduit configured to direct the flow of a first fluid. In a preferred embodiment of the invention this first fluid is air, although the first fluid could also be another gas or a liquid.

A second fluid conduit, configured to direct the flow of a second fluid, is positioned spacedly from the first fluid conduit. In preferred constructions this second fluid is also air, although the second fluid may also be another gas or a liquid. A thermoelectric means is positioned between the first and second fluid conduits to be operably associated with each of the two conduits. The thermoelectric means is adapted to transfer heat from the first fluid in the first fluid conduit to the second fluid in the second fluid conduit, thereby cooling the first fluid and rejecting heat into the second fluid at a higher temperature.

In those embodiments of the invention wherein the fluid within the second conduit is a gas, hereinafter referred to as the "second gas," the second fluid conduit is fitted with a moisture introduction means adapted for introducing a liquid, such as water, into the second gas. The moisture means may be adapted to introduce this liquid into the second fluid conduit at a location in that conduit which is upstream of the conduit's association with the thermoelectric means.

The moisture, i.e. the liquid, in the second gas flow absorbs heat from the second gas, thereby lowering the temperature of the second gas prior to the second gas coming into contact with that region of the second fluid conduit which contacts the thermoelectric means. When the quantity of heat corresponding to the latent heat of vaporization of the liquid has been absorbed by the liquid, the liquid undergoes a phase change from liquid to gas, i.e. to vapor. As the moisture changes from a liquid to a gas, the liquid absorbs energy while decreasing the dry-bulb air temperature of the second gas flow. This phenomena, in turn, tends to minimize the temperature differential between the temperature of the fluid in the first fluid conduit and the temperature of the second gas in the second fluid conduit.

In one embodiment of the invention specifically adapted for heating or cooling air for human use, the first fluid and the second fluid are both gases. Preferably, both gases are ambient air. These gases shall hereinafter be referred to as the first gas and the second gas. It has been found that the use of a moisture introduction-means in the second conduit is very beneficial in this particular embodiment in minimizing the aforedescribed temperature differential.

The correlation of the thermoelectric material temperature with the conduit fluid temperature can be related to a thermal resistance which is a function of base material conduction, airflow rate and convection coefficient. Generally speaking, the two temperatures would be within 15 degrees Celsius of each other. Accordingly, it should be understood that the temperature of the first gas flow corresponds generally within 15 degrees Celsius to the actual temperature of the thermoelectric material at the junction of the thermoelectric module and the first conduit. The temperature of the second gas flow also corresponds, within generally within 15 degrees Celsius to the actual temperature of the thermoelectric material at the junction of the thermoelectric module and the second conduit.

It follows that lowering the dry bulb temperature of the second gas flow by use of the moisture introduction means previously described will contribute to a lower temperature of the thermoelectric material at the junction of the thermoelectric module with the second conduit. The lower thermoelectric material temperature will in turn tend to minimize the temperature differential between the two junctions previously described.

It has been found that thermoelectric means of the type utilized in this invention achieve optimal operation when the temperature differential between the two junctions is minimized. The minimization of the temperature differential, by means of the introduction of liquid into the second gas flow, upstream of that gas flow's contact with the thermoelectric means therefore increases the efficiency of the thermoelectric means and therefore the efficiency of the heating and cooling system in general.

In another embodiment of the invention, provisions are made for controlling the operation of individual thermoelectric means or discrete groups of such thermoelectric means. In one construction the thermoelectric means includes a plurality of thermoelectric modules which are spacedly positioned from each other and preferably arranged in an array. Each of the thermoelectric modules, or in some instances each group of thermoelectric modules, is connected to a power supply means so that the quantity of power supplied respectively to each module, or group of modules, may be individually controlled. The quantity of power to be supplied to each module is determined by calculating or estimating the temperature differential between the temperature of the thermoelectric material at the junction of the thermoelectric module with the first fluid conduit and the temperature of the thermoelectric material at the junction of the thermoelectric module with the second fluid conduit. The temperature differential so calculated or estimated is then utilized to calculate the input current which would produce the optimal performance of the thermoelectric module, or group of modules, for the given conditions and cooling power requirements.

A power regulation means is utilized to control the respective quantity of current supplied to each thermoelectric module. In preferred constructions the power regulation means provides a quantity of electrical current to each module or group of modules corresponding to the respective optimal quantity of current calculated for each module, or group of modules.

In some embodiments, the invention may include a sensing means for actually sensing the temperature of the thermoelectric material at each of the two junctions previously described. Alternatively, the invention may include a sensing means adapted for sensing temperatures of other elements of the apparatus or the fluids treated thereby to provide data from which the temperatures of the thermoelectric material may be estimated. For example, the temperature of the fluid flows, either at locations within the conduits or at the inlets and outlets of those conduits may be sensed. Alternatively, the temperature of the conduit sidewalls may be sensed.

The invention may also include the use of an automated control system whereby the temperature readings sensed by the sensing means may be periodically or continuously monitored during the operation of the apparatus. The automated control system may include computation means adapted to receive the temperature readings from the sensing means and thereafter calculate a temperature differential across one or more of the thermoelectric modules. In a preferred construction, the computation means and the sensing means are adapted to sense temperatures of all the thermoelectric modules and thereafter calculate a temperature differential for each thermoelectric module. This calculation may be performed either periodically or continuously during the operation of the apparatus. The computation means may further be adapted, e.g. programmed, for determining the optimal power input for each respective thermoelectric module, or group of modules, based on the respective temperature differential determined for that thermoelectric module, or group of modules.

The power regulation means may be operatively associated with the computation means. The power regulation means is adapted to regulate or adjust the power being supplied to each of the respective thermoelectric modules, or group of modules, to accord with the optimal power input determined by the computation means for each specific module. The power regulation means may be adapted for adjusting the power input to the respective thermoelectric modules, or groups of modules, either on a continuous or semi-continuous basis.

In order to further enhance the operation of the apparatus, the fluid flow rate through either the first or second conduits or both conduits may be varied responsive to thermal loads and ambient conditions. The fluid flow rate may be controlled by adjusting the size of the fans, pumps or other fluid conveyance means or alternatively, adjusting the quantity of power supplied to such conveyance means.

The embodiment of the invention which utilizes means of regulating the power supplied to the various thermoelectric modules may also be fitted with the moisture introduction means previously described as part of the previously described embodiment.

In the embodiments previously described the thermoelectric means may include at least two thermoelectric modules, each module having a first side and a second side wherein the first sides of the thermoelectric modules are in parallel thermal contact with the first fluid conduit, and the second fluid conduit which is divided into sections wherein each section of the second conduit is in thermal contact with the second side of only one thermoelectric module. This configuration provides for independent "flotation" of the sections of the second conduit on the first conduit so that each of the sections of the second conduit expand and contract independent of each other, thereby minimizing the shear force exerted on the thermoelectric module which is between each section of the second conduit and the first conduit. Preferably there is a means for compressing the section of the second conduit, the thermoelectric module that is in thermal contact with the section of the second conduit and the first conduit to achieve optimum thermal transfer between the section of the second conduit and the first conduit.

A plurality of thermoelectric devices may be associated with one another to assemble a thermoelectric subunit. A plurality of thermoelectric subunits may then be removably associated with each other to assemble a thermoelectric apparatus having the required heating or cooling capacity. Preferably the orientation of the flow channels of the first conduit to the flow channels of the sections of the second conduit are perpendicular to each other to provide for the flow of the media being heated or cooled in a cross-flow design.

DETAILED DESCRIPTION OF THE INVENTION

Figure 1:
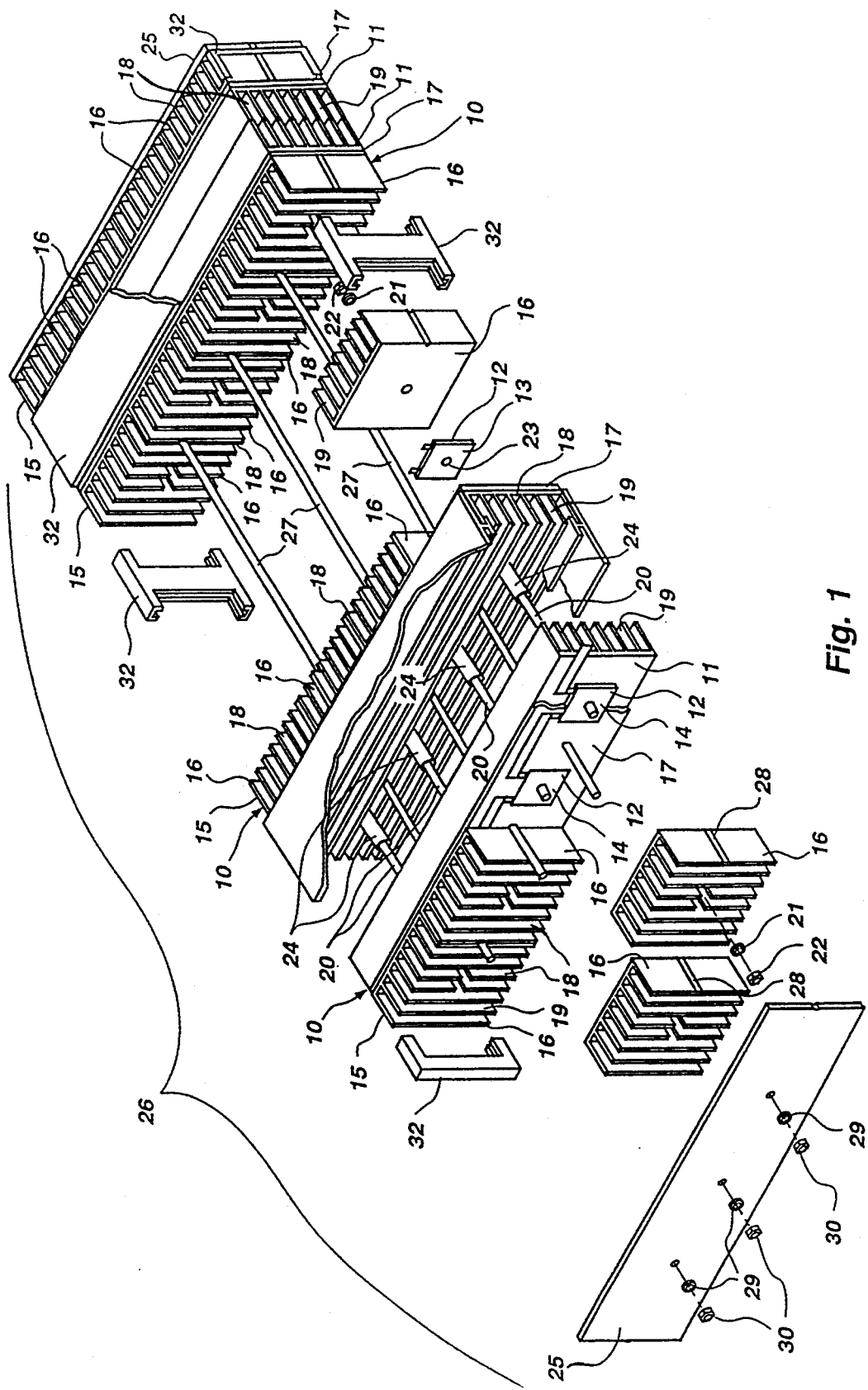
FIG. 1 is a partially exploded view of a thermoelectric subunit assembled from a plurality of thermoelectric modules.
Figure 2:
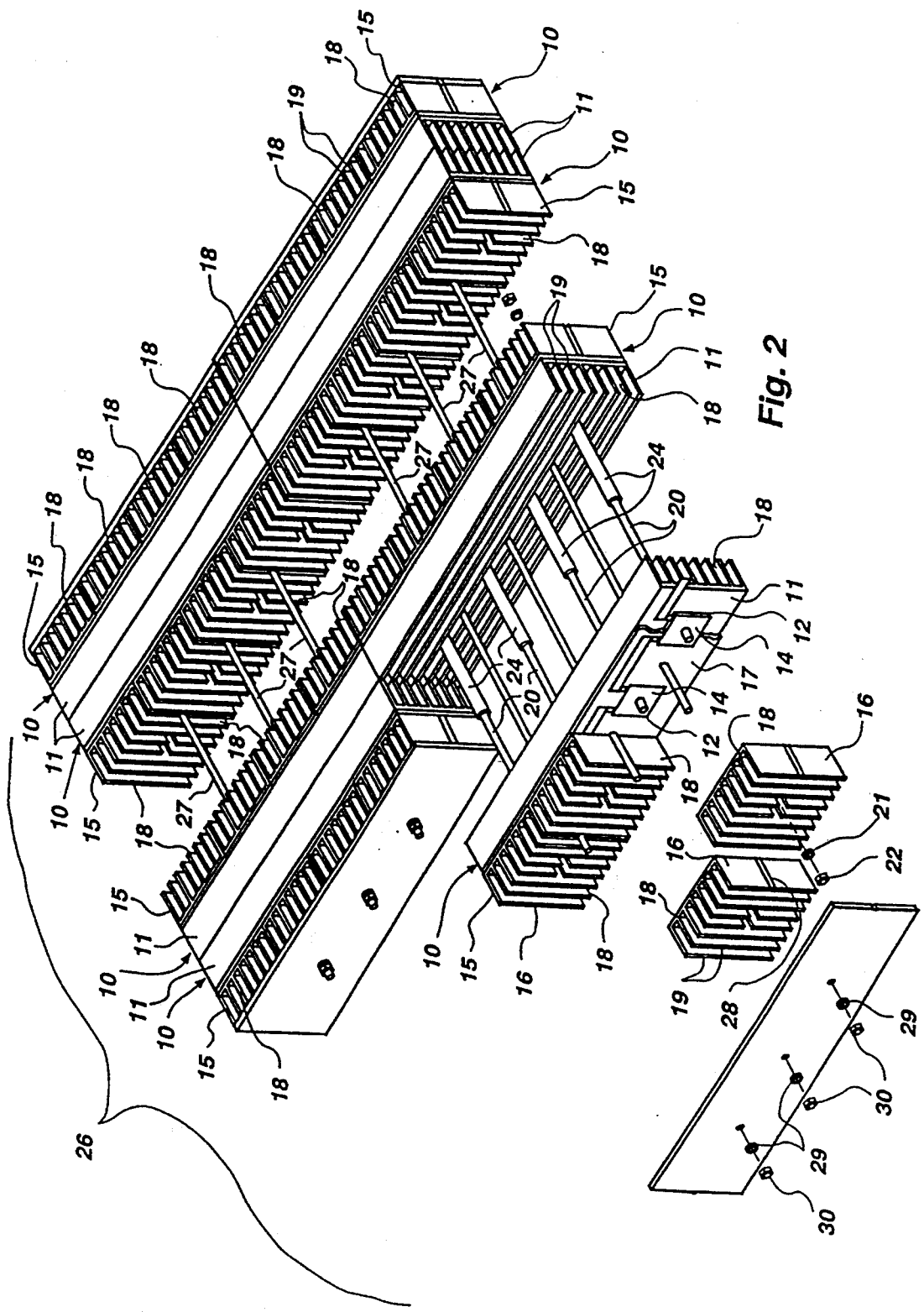
FIG. 2 is a partially exploded view of a layer of two thermoelectric subunits assembled from a plurality of thermoelectric modules.
Figure 4:
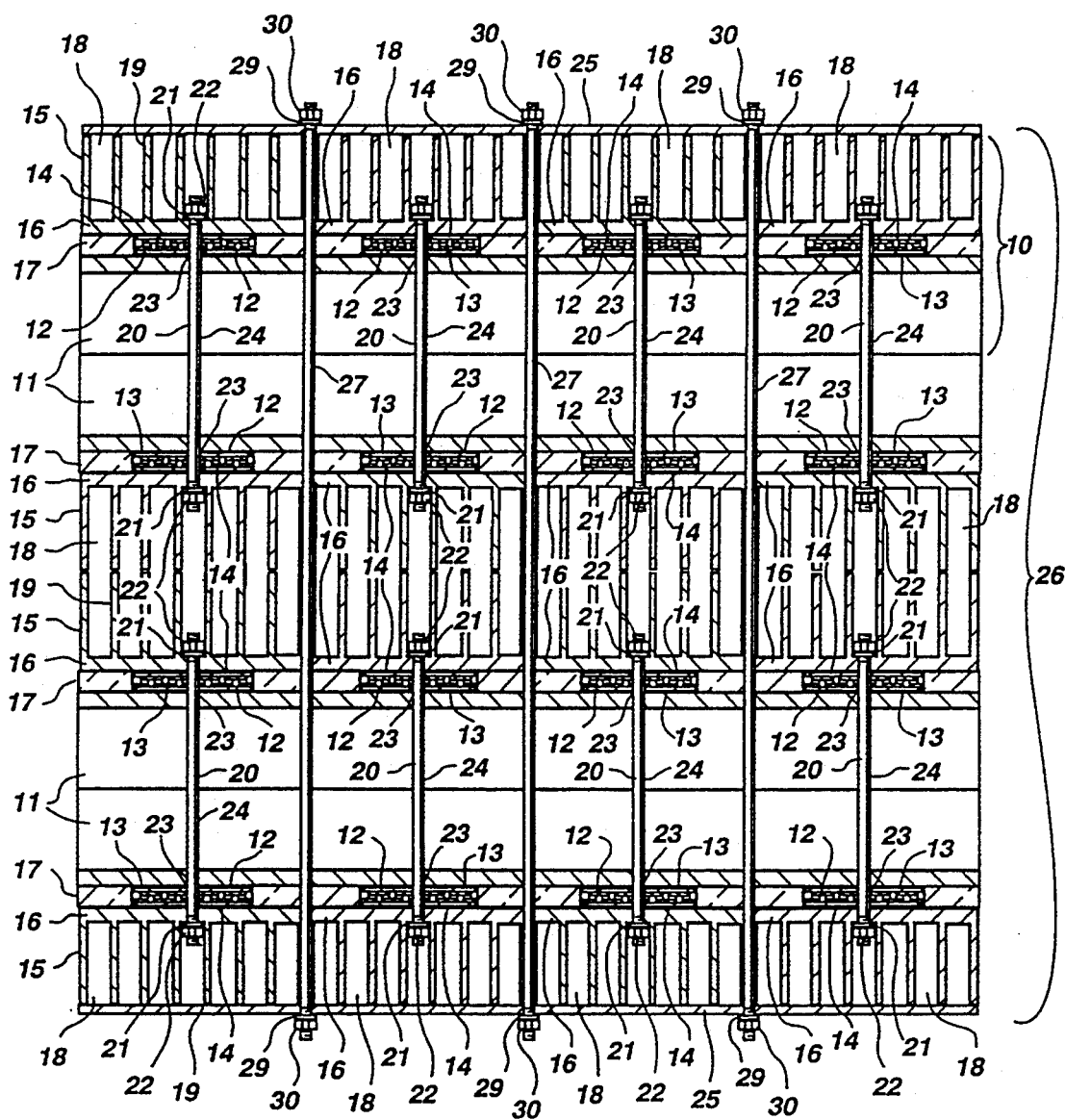
FIG. 4 is a cross-section of one thermoelectric subunit along sectional line 4—4 of FIG. 3.

Referring to FIG. 1, FIG. 2 and FIG. 4, a thermoelectric device 10 includes a first fluid conduit 11 and at least two thermoelectric modules 12, each having a first side 13 and a second side 14. The first side 13 of all thermoelectric modules 12 are in parallel thermal contact with first fluid conduit 11, and a second fluid conduit 15 which is divided into a plurality of sections 16. Each section 16 is in thermal contact with a second side 14 of only one of the thermoelectric modules 12.

Thermoelectric modules 12 are recessed in a gasket plate 17, which is preferably made of a thermally insulative material, such that first side 13 is substantially co-planer with one side of gasket plate 17 and the second side 14 is substantially co-planer with the opposite side of gasket plate 17. Gasket plate 17 and the thermoelectric modules 12 are positioned between first fluid conduit 11 and second fluid conduit 15. Each section 16, the thermoelectric module 12 that is in thermal contact therewith, and first fluid conduit 11 may be compressed against each other by a compression means which may be adjusted to achieve optimum conditions for thermal transfer between section 16 and first fluid conduit 11. The interface of the section 16 and the first fluid conduit may be coated with a thermal grease or other similar joint material to effect a thermally conductive interface.

Preferably, thermoelectric modules 12 are of the type readily available in the industry. Such modules may be a thermoelectric couple which includes a n-type element and a p-type element. Multiples of these couples are assembled electrically in series and thermally in parallel. The multiple couples are sandwiched between two flat plates that are electrically insulating and thermally conducting. The n-type and p-type elements are typically constructed respectively from semiconductor material, such as N-type bismuth telluride and P-type bismuth telluride. CP series Melcor brand thermoelectric modules which are available from Melcor Materials Electronic Products Corporation of Trenton, N.J. are an example of thermoelectric modules that may be used in the invention.

The preferred construction of first fluid conduit 11 and sections 16 is of a thermally conductive material, such as aluminum, which forms channels 18 within which the media, usually either a gas or liquid, which is being cooled or heated flows. For purposes of illustration it will be assumed hereinafter that this flow in both conduits is a gas. It should be understood that where gas is indicated, a liquid may also be utilized in other applications.

Longitudinal fins 19 may be located within the channels 18 to increase the efficiency of thermal transfer. In the installed configuration of the invention it is preferred that the fins 19 of the first conduit 11 be oriented in an upright, e.g. vertical orientation. This particular orientation facilitates the evacuation of condensate which may form out of the first gas flow as the temperature of that gas flow approaches the dew point temperature. It is preferred that the fins 19 be oriented such that the evacuation of the condensate may be accomplished by reliance on the force of gravity.

Although channel 18 of first fluid conduit 11 and channel 18 of section 16 may be oriented relative to each other such that the media flow in first fluid conduit 11 and media flow in section 16 are parallel to each other, the preferred orientation is for perpendicular media flow, as illustrated in the drawings. The perpendicular orientation is the cross-flow configuration.

In the illustrated embodiment of the invention, the compression means is a stud 20 having a biasing means, such as stud belville washers 21 and stud nuts 22 on each end of stud 20. The biasing means may be tightened to apply the desired compressive force. Stud 20 may extend through a pair of thermoelectric devices 10, thereby connecting them together and reducing by half the number of studs 20, stud belville washers 21 and stud nuts 22 required for assembly. Preferably studs 20 pass through a hole 23 in the center of the thermoelectric modules 12 and through protective sleeves 24.

Referring to FIG. 1, FIG. 2, FIG. 3 and FIG. 4, a pair of thermoelectric devices connected to another pair of thermoelectric devices and end plates 25 placed across sections 16 which are not mated to other sections 16 form a thermoelectric subunit 26. Thermoelectric subunit 26 is held together with assembly rods 27, which, in each pair of thermoelectric devices, pass through end plate 25, groves 28 which lie between sections 16, gasket plate 17 and first heat exchanger 11. Assembly rods 27 have a biasing means, such as a assembly belville washer 29 and a assembly nut 30 attached to each of the ends of assembly rods 27, to maintain a constant compressive force across thermoelectric subunit 26.

Figure 3:
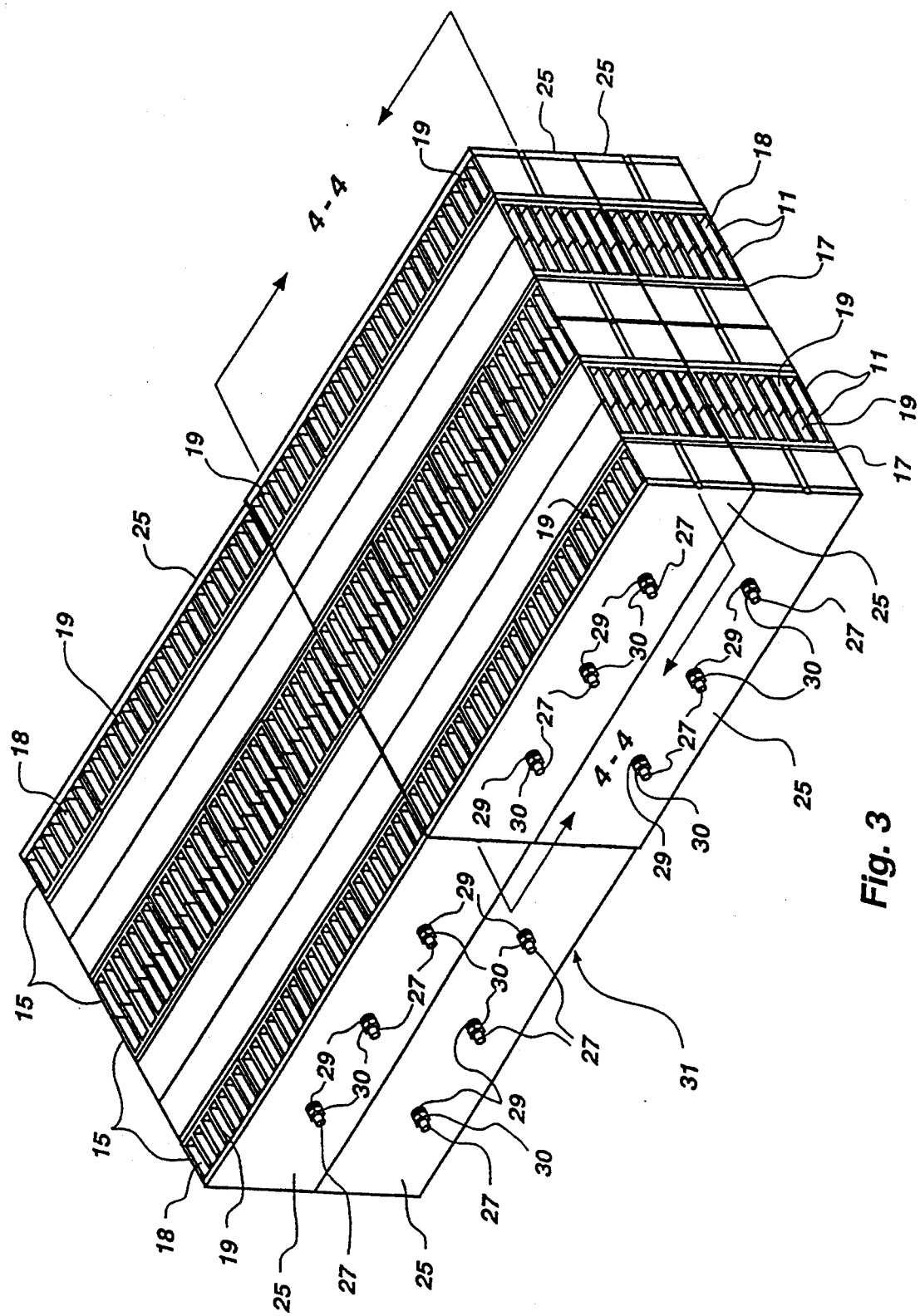
FIG. 3 is a perspective view of a thermoelectric apparatus assembled from two layers of thermoelectric subunits as illustrated in FIG. 2.

Referring to FIG. 2 and FIG. 3, a plurality of thermoelectric subunits 26 may be associated with each other to form a cross-flow thermoelectric apparatus 31. The heating and cooling capacity of thermoelectric apparatus 31 is dependant upon the number of thermoelectric modules 12 which are used in the thermoelectric apparatus 31. In the illustrated embodiment, a layer of thermoelectric subunits 26 is formed by butting the ends of two or more thermoelectric subunits 26 together. Two or more layers of thermoelectric subunits 26 are then stacked upon one another to form cross-flow thermoelectric apparatus 31. The surfaces where heat exchangers 11 of one thermoelectric device 10 mate with fluid conduits 11 of another thermoelectric device 10, where sections 16 of one thermoelectric device 10 mate with sections 16 of another thermoelectric device 10 or with end plates 25. Where the fluid conduits of one thermoelectric subunit mate to the fluid conduits of another thermoelectric subunit, the conduits are preferably sealed with gasket material 32 to minimize leakage of the media flowing through first fluid conduit 11 and second fluid conduit 15.

It is preferable to retain the cross-flow thermoelectric apparatus 31 within a frame (not illustrated) which utilizes horizontal biasing means (also not illustrated) to maintain positioning of thermoelectric subunits 26. Cross-flow thermoelectric apparatus 31 can be serviced quickly and efficiently because the failure of a thermoelectric module 12 requires only the replacement of a thermoelectric subunit 26, and not the complete disassembly of cross-flow thermoelectric apparatus 31.

Figure 5:
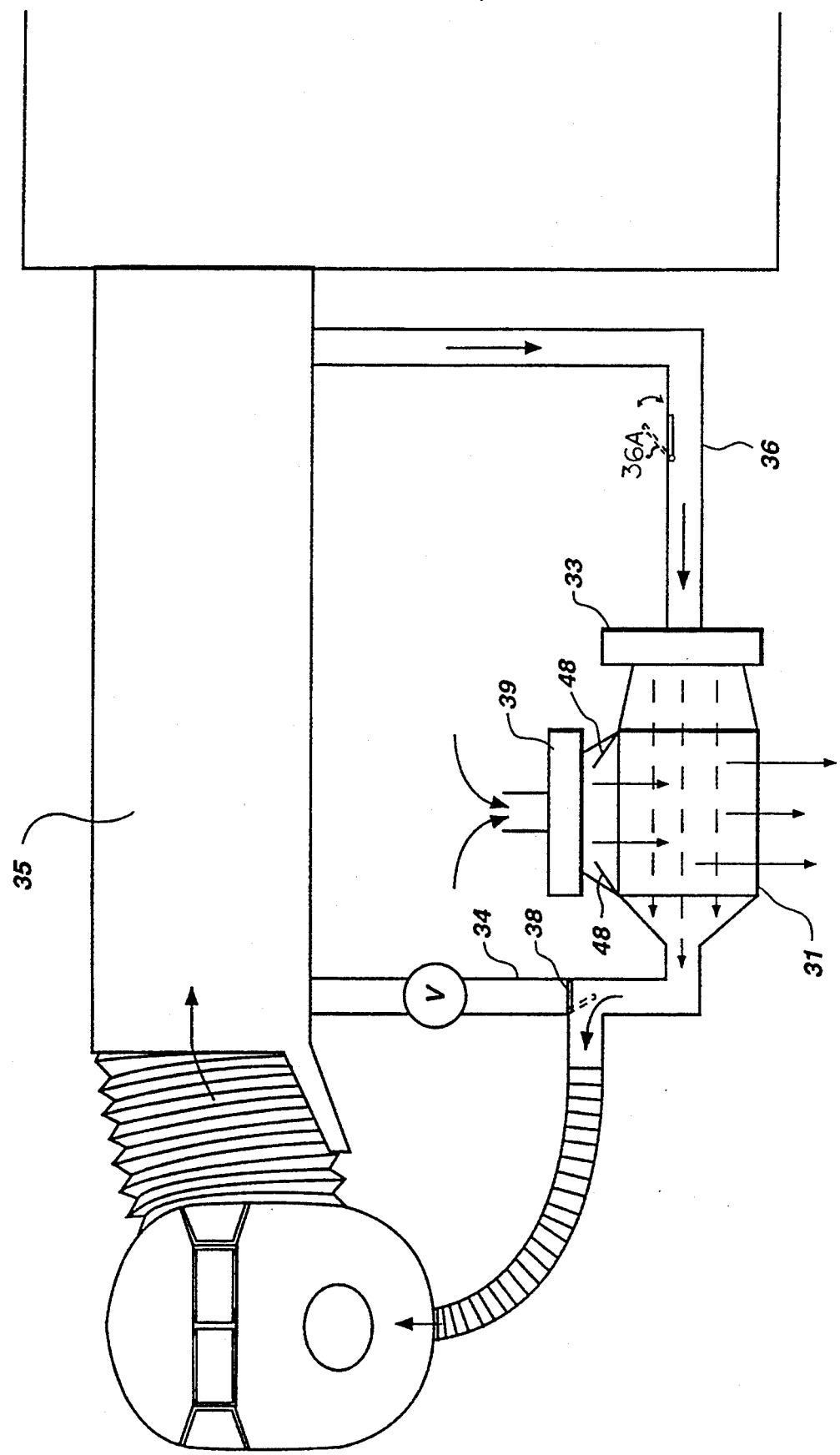
FIG. 5 is a schematic showing an application of the invention for large scale cooling and heating of an aircraft, including the passenger boarding bridge associated therewith.

Referring to FIG. 5, an application of the thermoelectric device for heating or cooling parked aircraft is schematically illustrated. Prior to the arrival of an aircraft, cross-flow thermoelectric apparatus 31 is connected to a first fan 33 which circulates air through a closed circuit consisting of first fan 33, first fluid conduit 11, output duct 34, air reservoir 35 and return duct 36, and the air in the closed circuit is brought to the desired temperature. Preferably, air reservoir 35 is the passenger boarding bridge to which the aircraft will dock, both ends of which are closed by doorways prior to the arrival of the aircraft. After the arrival of the aircraft, the aircraft is added to the closed circuit through diversion duct 37 by the changing of position of damper 38. The parked aircraft is then cooled or heated through the use of the precooled or preheated air produced by the instant invention. This heating or cooling is assisted by the use of the precooled or preheated air which has been stored in air reservoir 35. Ambient air is introduced into the heretofore closed circuit by means of inlet 36A during the course of the operation of the apparatus in order to produce an air mixture adapted for meeting and maintaining ASHRAE fresh air standards. Ambient air is forced through the second fluid conduits 15 by second fan 39 to provide fresh flow of ambient air through the thermoelectric apparatus 31. In FIG. 5 the second fan 39 is illustrated as being placed in the second conduit 15 upstream of that conduit's association with the thermoelectric apparatus 31. In an alternative construction, the fan 39 is placed in the second conduit downstream of the association of that conduit with the thermoelectric apparatus 31. This latter placement of the second fan permits the invention to avoid adding heat to the flow in the second conduit due to the operation of the second fan at a location upstream of the association of the second conduit with the thermoelectric apparatus 31. In this latter fan placement, the air is drawn through the second conduit and through the thermoelectric apparatus by the vacuum created by the second fan, instead of being forcefully and positively being driven through the apparatus by a fan placed upstream of the apparatus. This latter construction thereby avoids the possibility of raising the temperature of the second fluid flow, due to the action of the second fan, prior to the fluid's passage through the thermoelectric apparatus 31.

Figure 6A:
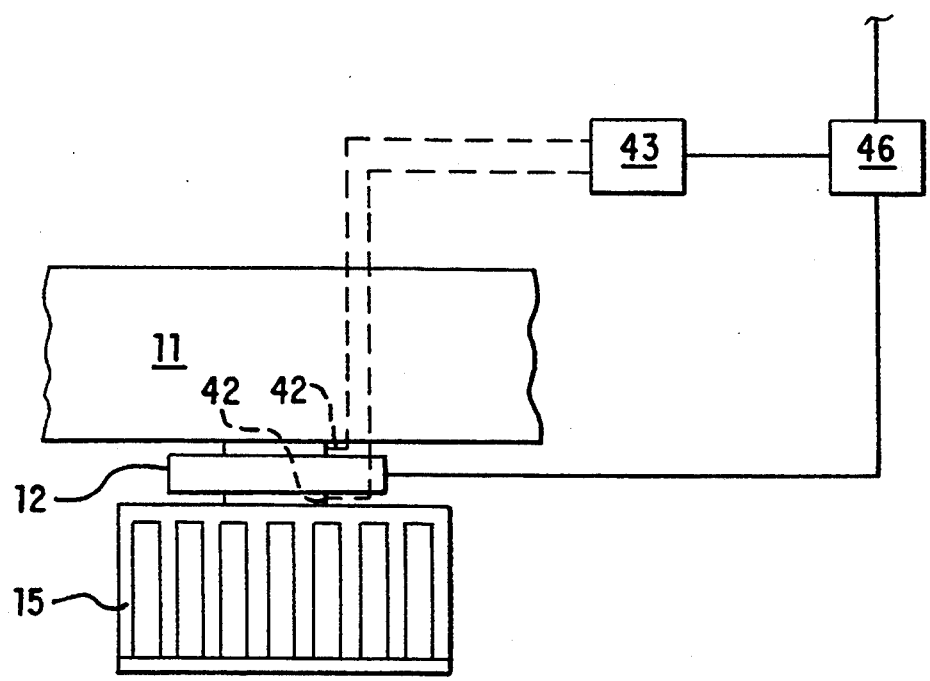
FIGS. 6 and 6a are side views of a first fluid conduit, one or more thermoelectric modules and a second fluid conduit.
Figure 6:
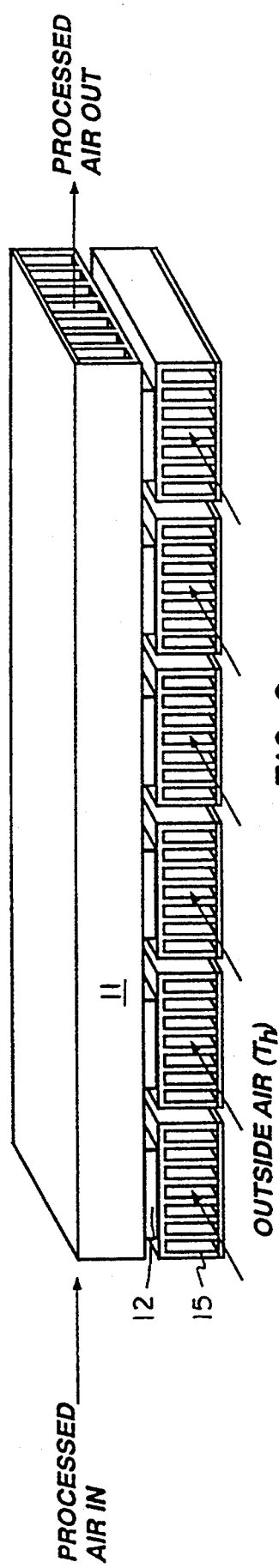

FIGS. 6 and 6A illustrate an embodiment of the thermoelectric device 31 of the invention in which each thermoelectric module 12 is adapted to receive an individually determined quantity of electrical power for its operation. The invention also contemplates that discrete groups of modules, as opposed to individual modules, may be supplied with an individually determined quantity of electrical power for their operation. It should be understood therefore that in the following described embodiment, where a reference is made to a thermoelectric module, in other embodiments the thermoelectric module could be replaced by a group of thermoelectric modules.

The quantity of power which is supplied to each thermoelectric module 12 is determined by analyzing the temperature differential between the temperature of the thermoelectric material at the junction of the thermoelectric module with the first fluid conduit 11 and the temperature of the thermoelectric material at the junction of the thermoelectric module with the second fluid conduit.

Figure 7:
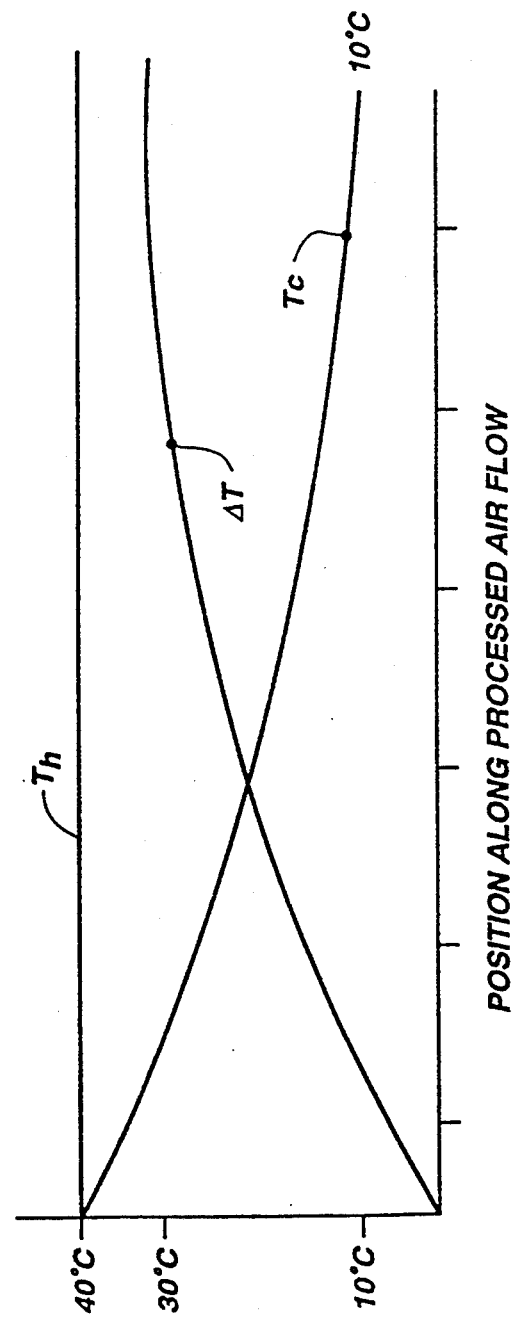
FIG. 7 is a graph depicting the temperature of the gas in the first conduit and the temperature of the gas in the second conduit at various locations along the respective lengths of the aforesaid conduits.

As shown in FIG. 7 the temperature of the thermoelectric material at the junction of the module 12 with the first fluid conduit 11, designated in FIG. 6 as Tc, decreases with an increasing negative slope with each succeeding module 12 as one proceeds along the length of the fluid conduit 11. It is assumed that the temperature of the thermoelectric material at the junction of the module with the second fluid conduit 15, herein designated as Th remains constant for each of the modules 12 over the corresponding length of the fluid conduit 15.

Figure 8:
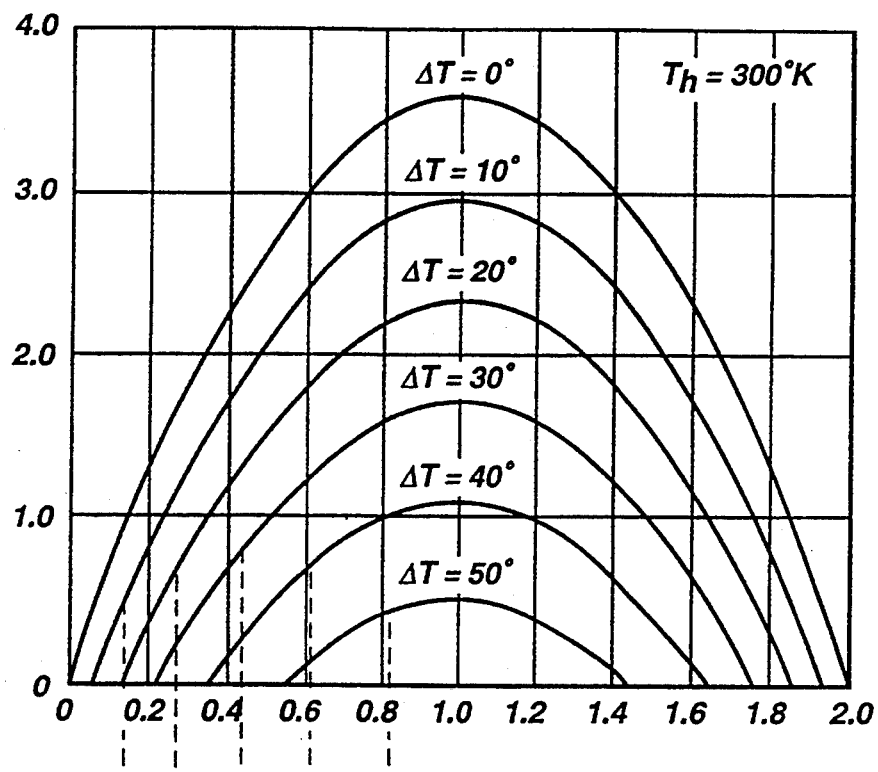
FIG. 8 is a graph depicting the heat pumping capacity of an individual thermoelectric module as a function of the current passing through the thermoelectric module for various temperature differentials.

Noticeably, delta T, the temperature differential between Tc and Th increases over the length of the first fluid conduit. As shown, delta T is increasing over the aforesaid length with a decreasing slope. For purposes of the instant example, the ambient temperature is assumed to be 40 degrees Celsius (C). The final temperature of the gas in the first fluid conduit is 10 degrees C. As depicted in FIG. 8 the heat pump capacity of a thermoelectric module increases at constant current for decreasing values of delta T. It follows that thermoelectric modules are most efficient when the delta T between the temperatures of the opposing faces of the thermoelectric material and hence the differential between the temperatures of the two gases on the opposing sides of the thermoelectric module is minimized.

Figure 9:
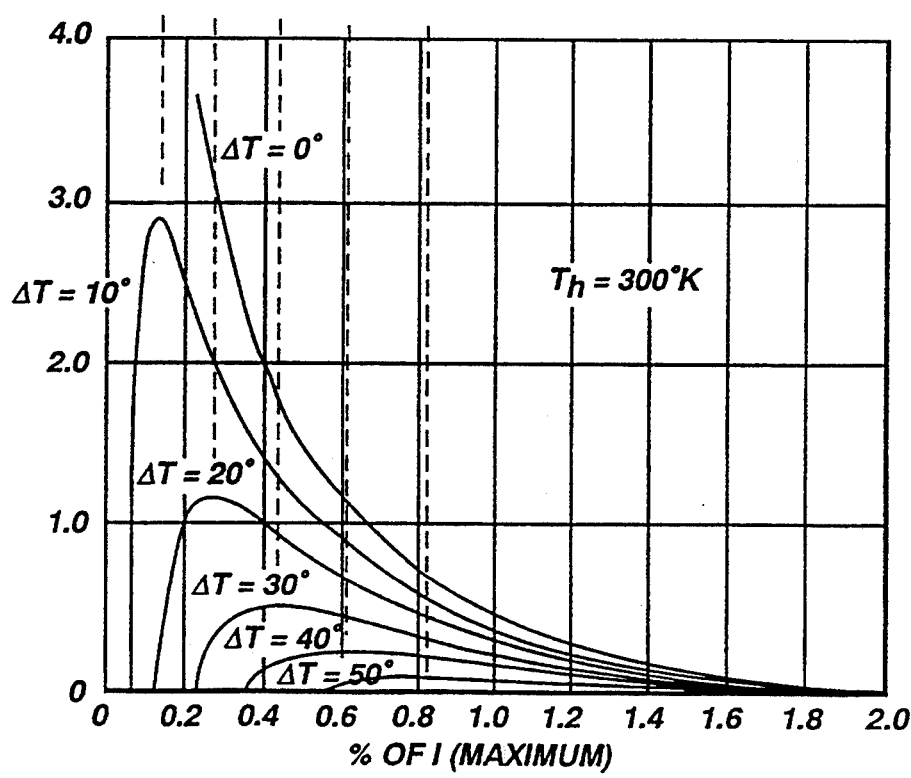
FIG. 9 is a graph which illustrates the coefficient of performance of a thermoelectric module as function of the current passing through the thermoelectric module for various temperature differentials.

FIG. 9 illustrates that thermoelectric modules achieve a maximum coefficient of performance for a given delta T. As used herein the terminology "coefficient of performance" (COP) shall be understood to mean the ratio of cooling or heating power divided by electrical input power. The curves illustrated in FIG. 9 were generated by means of the expression:

$$COP = \frac{2i - i^2 - \frac{\Delta T}{\Delta T_m}}{2\left(i^2 + \frac{\Delta T}{T_c} i\right)}$$

where $\Delta T_m = \frac{1}{2} Z T_c^2$ i = the electrical current

Z = The Figure of Merit of the thermoelectric material as defined hereinafter.

Utilizing this information, the instant invention achieves enhanced performance characteristics by individually adjusting the current passing through each thermoelectric module. The amount of current supplied to each thermoelectric module is determined by identifying the maximum coefficient of performance from the graph in FIG. 9 for the temperature differential across each particular thermoelectric module 12. Recognizing that delta T increases along the length of the first gas conduit in the direction of the flow in that conduit, it will be appreciated that the optimum current input for each subsequent module along the length of the first gas conduit will increase along the length of that conduit in the same direction of flow.

In the illustrated embodiment, the delta T is for determined for a given thermoelectric module 12 by initially taking a temperature reading of the thermoelectric material at the junction of the thermoelectric module and the first conduit as well as a temperature reading of the thermoelectric material at the junction of the thermoelectric module and the second conduit. These temperature readings are obtained by means of sensors 42. These sensors may be of conventional construction, e.g. a conventional electrically powered thermocouple. As illustrated a plurality of sensors 42a is positioned along the array of modules 12. Each sensor 42a is paired with a respective thermoelectric module 12 and is located on the module at a location proximate the mounting of its respective thermoelectric module 12 to the conduit 11. A plurality of sensors 42b is also mounted along the array of modules. Each sensor 42b is paired with a respective module 12 and is mounted on its module at a location proximate the mounting of its respective thermoelectric module 12 to the conduit 15. Each sensor 42a is preferably paired with a respective sensor 42b, whereby each pair of sensors samples the temperature of the thermoelectric module at both of its opposing faces.

The sensors 42 may be connected to a computation means 43, which may be a conventional microprocessor programmed to receive signals from the various sensors. The computation means is further adapted to compare the temperature readings for each pair of sensors 42a and 42b for each respective thermoelectric module 12 and determine a temperature differential or delta T for each thermoelectric module. Once the delta T has been determined for a particular thermoelectric module, the computation means is programmed to determine the peak value of the coefficient of performance for the particular delta T. Determination of this peak value identifies the optimum current which should be supplied to the particular thermoelectric module in order to achieve optimal performance by that thermoelectric module. Because optimal thermoelectric performance by the thermoelectric modules may not produce the required cooling power for a given application, it should be understood that for various reasons the user may elect to operate the modules at current inputs within a predetermined range about the determined peak value. In many embodiments of the invention the microprocessor is further programmed to calculate an operating current (I) for each thermoelectric module.

In a preferred method, this operating current (I) is found within a range which extends between the value for the optimum current (Iopt) and the value for the maximum current (Imax).

For a given application of the invention, initially a desired cooling power is provided. The temperatures Th and Tc are either estimated or sensed for each thermoelectric module. For each module or group of modules, a quantity $I_{opt}$ is determined by the microprocessor by using the following formula:

$$I_{opt} = \frac{k \Delta T (1 + \sqrt{1 + ZT})}{S T \lambda}$$

wherein k is the thermal conductivity of the thermal electric material of the thermal electric module;

$\Delta T = [T_n - T_c]$;

Z = the figure of merit of the thermal electric material which may be expressed as:

$$Z = \frac{s^2}{\rho k}$$

wherein s is the Seebeck coefficient, $\rho$ is the electrical sensitivity of the thermal electric material and k is the thermal conductivity of the thermal electric material;

s = the Seebeck coefficient;

T is the average temperature of the thermal electric material, i.e. and $\lambda = 1/\alpha$ where l = length of the thermal electric material and a is the cross-sectional area of the thermal electric material.

For each module or group of modules the quantity $I_{max}$ is then determined. $I_{max}$ is defined by the expression $$I_{max} = \frac{K}{S \lambda} (\sqrt{1 + 2Z T_h} - 1)$$

wherein the variables K, $\Delta T$, Z, T, S and $\lambda$ are defined as set forth above. The operating current I to be supplied to each module or group of modules is then calculated by the microprocessor by using the following expression:

$$I = I_{opt} + \beta(I_{max} - I_{opt})$$

where $\beta$ may be varied from 0.0 to 1.0

In one method $\beta$ is initially set at 0.5. A respective value for I is then calculated for each module or group of modules by the microprocessor.

Each thermoelectric module is wired to a current regulator 46. The current regulator 46 is also interconnected to the microprocessor 43. The microprocessor is programmed to relay a command to the regulator 46 to cause the regulator to supply a quantity of electrical current to each particular thermoelectrical module in an amount corresponding to the particular quantity of current I which the microprocessor has calculated for that particular thermoelectric module.

The amount of current supplied to each module is therefore equal to the value of I calculated for that respective module. With each thermoelectric module operating at its respective I current, the temperature of the air exiting the first fluid conduit 11, hereinafter denoted as Texit is sensed i.e. sampled by a conventional temperature sensing apparatus, e.g. a thermometer. Texit is then compared to the air temperature Tcal which has been calculated, pursuant to formulas well known in the art, as being the exit temperature required to achieve the required cooling power for the given application. If the temperature of the air exiting the cooling system Texit is below the calculated temperature Tcal., then the value of $\beta$ is decreased by a preselected increment, e.g. 0.05. The respective value of I for each of the thermoelectric elements are then recalculated using the new value for $\beta$. Thereafter current corresponding to the new I values is supplied respectively to the various thermoelectric modules by the microprocessor controlled current regulator 46. The exit temperature Texit is then taken again and compared to the Tcal. If Texit is less than Tcal., $\beta$ is then decreased again by a selected increment, e.g. 0.05. If Texit is greater than Tcal, $\beta$ is increased by a selected increment, e.g. one half of the increment which was previously added to $\beta$ to achieve the then present value of $\beta$. In both cases I is then recalculated again using the new value for $\beta$. The quantity of current corresponding to the next generation of I values is then supplied to the respective modules and the temperature Texit is again sampled. The value of Texit is then again compared to Tcal. The above process of either increasing $\beta$ or decreasing $\beta$ and recalculating $\beta$ is then repeated together with the subsequent recalculations of I and the accompanying regulation of currents I to the respective modules.

This process is continued on an iterative type approach until the apparatus achieves a set of values for I which results in an exit temperature equal to the calculated temperature value Tcal.

The instant apparatus may include a microprocessor adapted to continuously sense, i.e. sample the temperatures of the thermoelectric modules and thereafter compare those temperatures with the respective values for I. Alternatively, the microprocessor can be programmed to sense, i.e. sample, the temperatures of the various thermoelectric modules at predetermined time intervals, e.g. every minute, and thereafter compute the respective I values.

While it is specifically indicated that the temperatures of the junctions of the thermoelectric module with the first conduit and the second conduit are sampled for computational purposes, it should be understood that alternative temperature readings may be substituted for the temperature readings at the above said junctions. For example, a conventional air temperature apparatus could be used to sense the temperature of the fluid flow in each conduit proximate the junction of the conduit with each respective thermoelectric element. Alternatively, a thermocouple or other temperature sensing apparatus could be used to sense the temperature of the conduit sidewall for each conduit at a location proximate the junction of each conduit with each respective thermoelectric element. It should be understood that the temperature of the fluid in the conduit and the temperature of the thermoelectric material at the junction of the conduit with the thermoelectric material should all be within 15° C. of one another.

It should be appreciated that it is the temperatures on the opposing faces of the thermoelectric material which are critical to calculating the values for the current I. Sensing the temperatures of either the fluid flow or the conduit sidewalls may be used as a means of approximating the temperatures of the opposing faces of the thermoelectric material. Accordingly, these alternative temperature readings produce less accurate, but nevertheless acceptable temperature approximations for purposes of determining the values for I. Sensing the inlet and outlet temperatures of the two fluid conduits, would also provide a sufficient data base from which the I values could be determined. It is further recognized that other temperature readings could also be used to approximate the temperatures of the opposing faces of the thermoelectric material.

The computation means, e.g. a microprocessor, is intercooperated with a control means, e.g. the current regulator 46 which is adapted to supply the operating current to each particular thermoelectric module 12. It should be recognized that the present system can be constructed and programmed to permit the temperatures monitored by sensors 42 to be read periodically at predetermined intervals. Alternatively, the system can be constructed to permit continuous monitoring of the aforesaid temperatures. Further, the computation means can be constructed to permit either periodic or continuous computation of optimum current values. Moreover, the control means can also be constructed to permit continuous or periodic regulation of the current being supplied to the thermoelectric modules. It follows that the current system can be utilized to provide a means of continuously optimizing the individual operational characteristics of each thermoelectric module responsive to the changes in the temperature differential extant within a determined spatial ambit of the particular thermoelectric module. The instant invention therefore avoids the inefficiencies which would result from providing a uniform current to each thermoelectric module in the array and instead the instant system maximizes the operational characteristics of the thermoelectric modules by restricting their power consumption to those current levels which yield a maximum heat transfer.

Referring again to FIG. 5, a moisture means 48 is illustrated as being associated with the second fluid conduit 15. This moisture means may be a plurality of injectors connected to a source of water, which may be pressurized. Alternatively, the moisture means may be any other structure adapted for introducing water into a flow stream. In one embodiment of the invention, the water which is removed from the first gas flow in the form of condensate is collected as it drains from the fins of the conduit 11, and thereafter directed to the moisture introduction means for purposes of its introduction into the second gas flow.

When water is introduced into the gas flow in the second conduit 15, the water absorbs heat which is contained in the air flow. The absorption of that heat by the water tends to lower the temperature of the air in the second gas flow. The heat is absorbed by the water until the quantity of heat reaches the quantity corresponding to the latent heat of vaporization for the water. At this point the water is vaporized.

Depending on the temperature of the air in the second gas flow, the water may be vaporized prior to the entry of the gas flow into that section of the second conduit which is in contact with the thermoelectric modules. With the water being totally vaporized prior to the second gas flow being affected by the thermoelectric modules, the second gas flow reaches the thermoelectric modules at a considerably reduced temperature due to the effect of the water absorbing the heat from the gas flow.

In the event that the water is not completely vaporized by the time it reaches the section of the second conduit associated with the thermoelectric modules, and that second gas flow is subsequently brought into contact with the sidewalls of the second conduit which has been heated by a thermoelectric module 12, heat from that sidewall is absorbed by the second gas flow and more particularly by the water in that second gas flow. This absorption of the heat by the water occurs without an accompanying increase in the temperature of the second gas flow. Since the thermoelectric modules, according to the conclusions illustrated in FIG. 8 achieve higher heat pumping capabilities at lower values of delta T, it follows that constraining any increase in the temperature of the second gas flow in the second fluid conduit tends to maximize the operational heat pump characteristics of the thermoelectric modules 12. Accordingly, the use of the moisturized air tends to optimize the effectiveness of the thermoelectric modules by minimizing the delta T across the modules.

Figure 10:
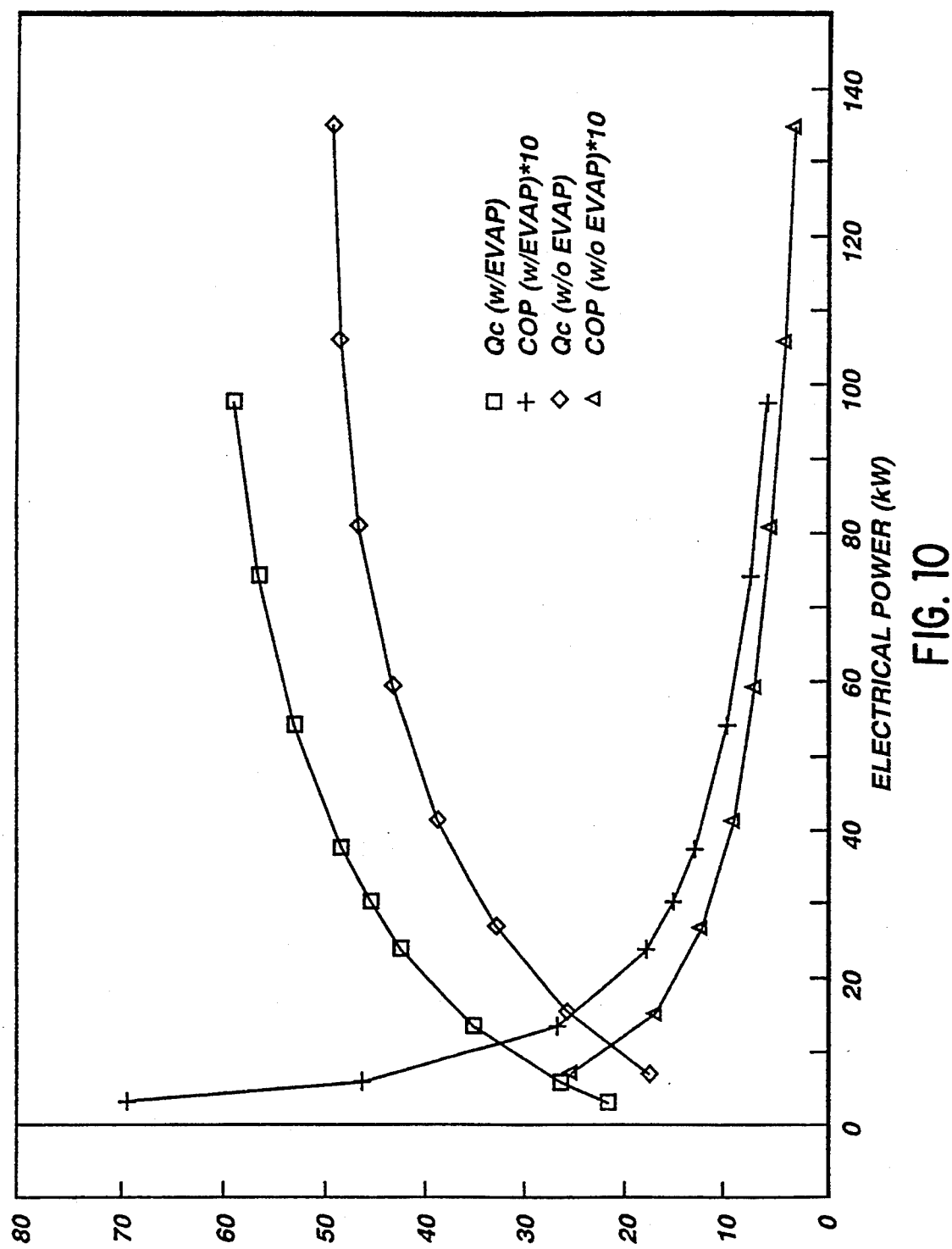
FIG. 10 is a graph illustrating the effects of evaporative cooling of the waste gas; the graph is depicted in terms of cooling power and coefficient of performance verses electric power.
Figure 11:
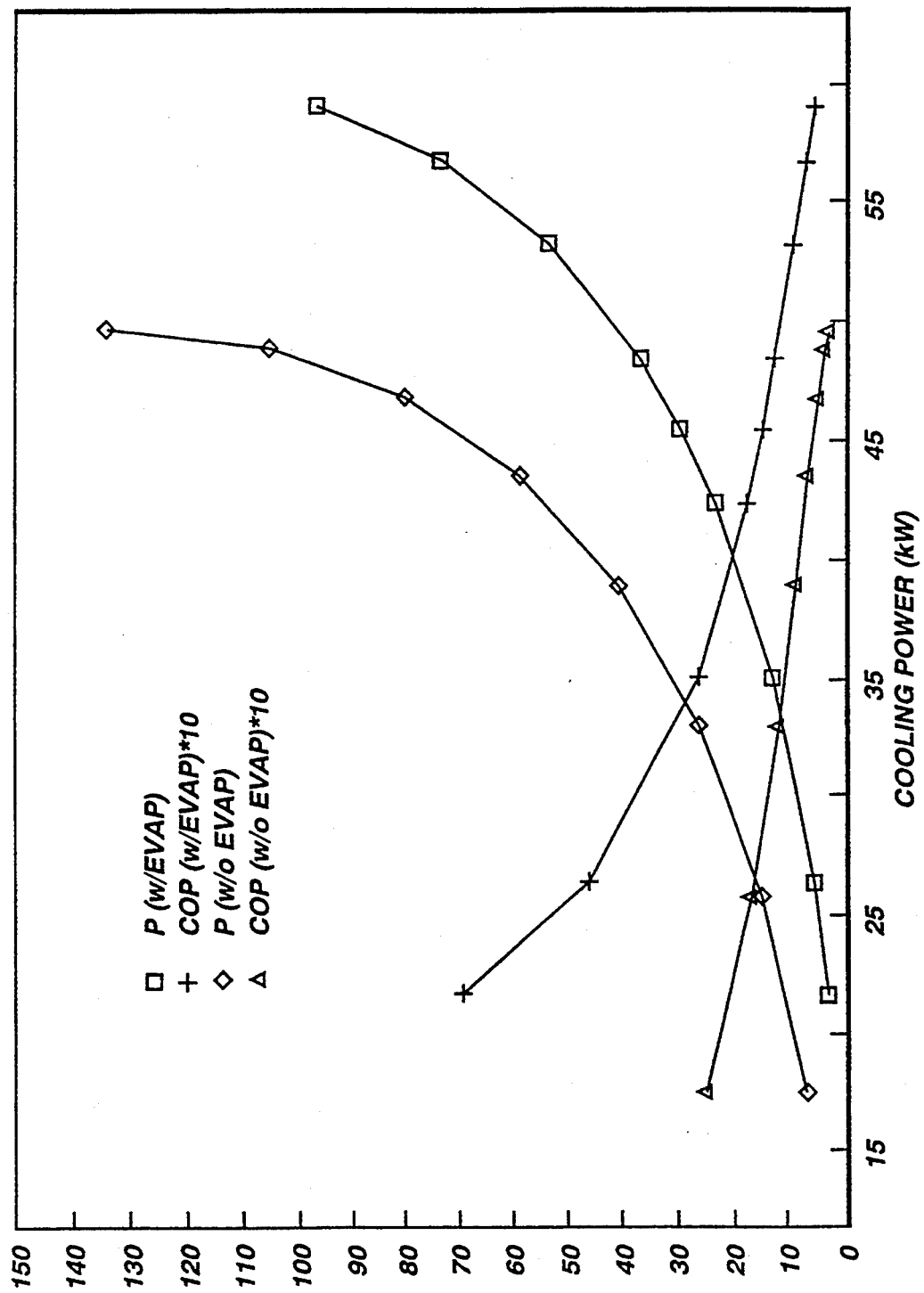
FIG. 11 is a graph which demonstrates the effects of the evaporative cooling of the waste gas; the graph depicts electric power and coefficient of Performance verses cooling power.

FIGS. 10 and 11 illustrate the benefits of introducing moisture, and particularly water, into the second gas flow in conduit 15 upstream of that conduit's connection to the thermoelectric modules 12. The two graphs reflect computed data from two systems which each included a first fluid conduit, a second fluid conduit and a plurality of thermoelectric modules arranged according to the manner described above. The sole distinguishing feature which separated the two systems was the use in one of the systems of a moisture introduction means as previously described. As shown in FIG. 10 the coefficient of performance for a system which utilizes the evaporative cooling which results from the use of such moisture introduction means is significantly increased over an identical system, for identical power consumption, which does not include evaporative cooling of the second gas in the second fluid conduit. Notably, the cooling power of the system which utilizes evaporative cooling, is also significantly larger than the system which does not include such a system, at constant power consumption.

FIG. 11 illustrates that a system utilizing evaporative cooling obtains significant reductions in power consumption for a given cooling power requirement. Further, FIG. 11 also indicates that the system fitted with an evaporative cooling means also achieves enhanced coefficient of performance, especially at low cooling power requirements.

It should be understood that an evaporative cooling of the waste gas, i.e., the gas in the second fluid conduit, may also be incorporated with the previously described embodiment which utilizes a variability in the current supplied to each of the thermoelectric modules to achieve enhanced operational characteristics.

While the previously described apparatus has been described for purposes of producing a supply of cooled air for human use, it should be understood that a reversal of the polarity of the thermoelectric elements would result in the production of heated as opposed to cooled air through the first conduit 11.

Whereas the invention is here illustrated and described with specific reference to an embodiment thereof presently contemplated as the best mode in carrying out such invention, it is to be understood that various changes may be made in adapting the invention to different embodiments without departing from the broad inventive of concepts disclosed herein and comprehended by the claims that follow.

What is claimed is:

1. A thermoelectric unit for cooling or heating a gas, said thermoelectric unit comprising:
    a first conduit adapted to direct a first gas flow;
    a second conduit adapted to direct a second gas flow;
    a plurality of thermoelectric modules each of which is operatively connected between said first and second conduits so as to transfer heat from the first gas flow to the second gas flow; and
    a plurality of regulated power sources, each of which supplies a different amount of power to a corresponding different one said plurality of thermoelectric modules.

2. The thermoelectric unit of claim 1 further comprising a controller individually controlling the operation of each of the plurality of regulated power sources so as to supply the different amounts of power to each of the plurality of thermoelectric modules.

3. The thermoelectric unit of claim 2 further comprising a plurality of sensors each of which senses a temperature differential across a corresponding different one of said plurality of thermoelectric modules, and wherein the controller individually controls the operation of each of the plurality of regulated power sources based on the sensed temperature differential across the thermoelectric module corresponding to that power source.

4. The thermoelectric unit of claim 3 wherein said controller comprises a computer programmed to compute an operating current for each of said plurality thermoelectric modules based on the temperature differential across that thermoelectric module, and wherein each of the regulated power sources supplies the computed operating current to its corresponding thermoelectric module.

5. The thermoelectric unit of claim 4 wherein the operating currents for the thermoelectric modules increase in the direction of gas flow through the first passageway.

6. The thermoelectric unit of claim 4 wherein each of the plurality of thermoelectric modules comprises a thermoelectric material having opposed faces and wherein each of said plurality of sensors senses a temperature differential across the opposed faces of the thermoelectric material in the corresponding thermoelectric module.

7. The thermoelectric unit of claim 4 further comprising a temperature measuring device measuring an exit temperature for the first passageway, said exit temperature being the temperature of gas exiting from the first passageway, and wherein said controller is programmed to iteratively adjust the operating currents supplied to each of said thermoelectric modules by its corresponding power source so as to achieve a desired value for the measured exit temperature.

8. The thermoelectric unit of claim 2 further comprising an upstream sensor and a downstream sensor, wherein the upstream sensor senses a temperature at an upstream location within the first gas flow and the downstream sensor senses a temperature at a downstream location within the first gas flow and wherein said controller comprises a computer programmed to use the sensed upstream and downstream temperatures to compute a temperature differential across each of said plurality of thermoelectric modules, and wherein the controller individually controls the operation of each of the plurality of regulated power sources based on the computed temperature differential across the thermoelectric module corresponding to that power source.

9. The thermoelectric unit of claim 4 for cooling or heating a gas within a first and second reservoir, wherein the first reservoir is coupled to the second reservoir so that the gas may flow from one to the other, said thermoelectric unit further comprising:
an output duct connected to an outlet side of the first conduit, said output duct adapted to be connected to the first reservoir so as to direct the first gas flow into the first reservoir;
a return duct connected to an inlet side of the first conduit, said return duct adapted to be connected to the first reservoir so as to return the first gas flow from the first reservoir to the first conduit;
a damper connected between the output duct and the outlet side of said first conduit, said damper having a closed position in which the first gas flow is directed into the output duct and an open position in which at least a portion of the first gas flow is diverted away from the output duct; and
a diversion duct connected to the damper, said diversion adapted to be connected to the second reservoir so as to direct the diverted gas flow into the second reservoir.

10. The thermoelectric unit of claim 4 for cooling or heating a gas within a reservoir, said thermoelectric unit further comprising:
an output duct connected to an outlet side of the first conduit, said output duct adapted to be connected to the reservoir so as to direct the first gas flow into the first reservoir; and
a return duct connected to an inlet side of the first conduit, said return duct adapted to be connected to the reservoir so as to return the first gas flow from the first reservoir to the first conduit.

11. The thermoelectric unit of claim 4 further comprising a moisture injector associated with the second conduit and for injecting moisture into the second gas flow.

12. The thermoelectric unit of claim 11 wherein the moisture injector injects moisture into the second conduit upstream of said plurality of thermoelectric modules.

* * * * *